(12) United States Patent
Bazan et al.

(10) Patent No.: US 6,998,866 B1
(45) Date of Patent: Feb. 14, 2006

(54) CIRCUIT AND METHOD FOR MONITORING DEFECTS

(75) Inventors: Greg Bazan, Essex Junction, VT (US); John M. Cohn, Richmond, VT (US); Matthew S. Grady, Burlington, VT (US); Phillip J. Nigh, Williston, VT (US); Leah M. P. Pastel, Essex, VT (US); Thomas G. Sopchak, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 10/710,640

(22) Filed: Jul. 27, 2004

(51) Int. Cl.
*G01R 31/26* (2006.01)

(52) U.S. Cl. .................. 324/765; 324/73.1; 714/724; 714/726

(58) Field of Classification Search .................. None
See application file for complete search history.

(56) References Cited

U.S. PATENT DOCUMENTS

| | | | |
|---|---|---|---|
| 3,942,150 A | 3/1976 | Booth, Jr. et al. | |
| 4,947,357 A * | 8/1990 | Stewart et al. | 714/726 |
| 5,550,843 A | 8/1996 | Yee | |
| 5,610,927 A * | 3/1997 | Segars | 714/730 |
| 5,675,589 A | 10/1997 | Yee | |
| 5,881,067 A * | 3/1999 | Narayanan et al. | 714/726 |
| 5,999,003 A | 12/1999 | Steffan et al. | |
| 6,017,771 A | 1/2000 | Yang et al. | |
| 6,185,707 B1 | 2/2001 | Smith et al. | |
| 6,210,983 B1 | 4/2001 | Atchison et al. | |
| 6,341,241 B1 | 1/2002 | Mugibayashi et al. | |
| 6,389,323 B1 | 5/2002 | Yang et al. | |
| 6,470,229 B1 | 10/2002 | Wang et al. | |
| 6,470,485 B1 | 10/2002 | Cote et al. | |
| 6,473,665 B1 | 10/2002 | Mugibayashi et al. | |
| 6,513,151 B1 | 1/2003 | Erhardt et al. | |
| 6,556,949 B1 | 4/2003 | Lyon | |

FOREIGN PATENT DOCUMENTS

| | | |
|---|---|---|
| JP | 9027531 | 1/1997 |
| WO | WO 03/028412 A2 | 4/2003 |

OTHER PUBLICATIONS

Edirisooriya et al., Scan Chain Fault Diagnosis With Fault Dictionaries, 0-7803-2570-2/95 IEEE, pp. 1912-1915.
Edirisooriya et al., Diagnosis of Scan Path Failures, 0-818S6-7000-2/95, pp. 250-255.

* cited by examiner

*Primary Examiner*—Minh N. Tang
(74) *Attorney, Agent, or Firm*—Schmeiser, Olsen & Watts; Robert A. Walsh

(57) ABSTRACT

A circuit and a method for monitoring defects in an integrated circuit chip. The circuit including a defect monitor portion and a sense element portion, the defect monitor portion either coupled to inputs of sense elements arranged in a chain or coupled between sense elements and forming portions of the chain.

30 Claims, 8 Drawing Sheets

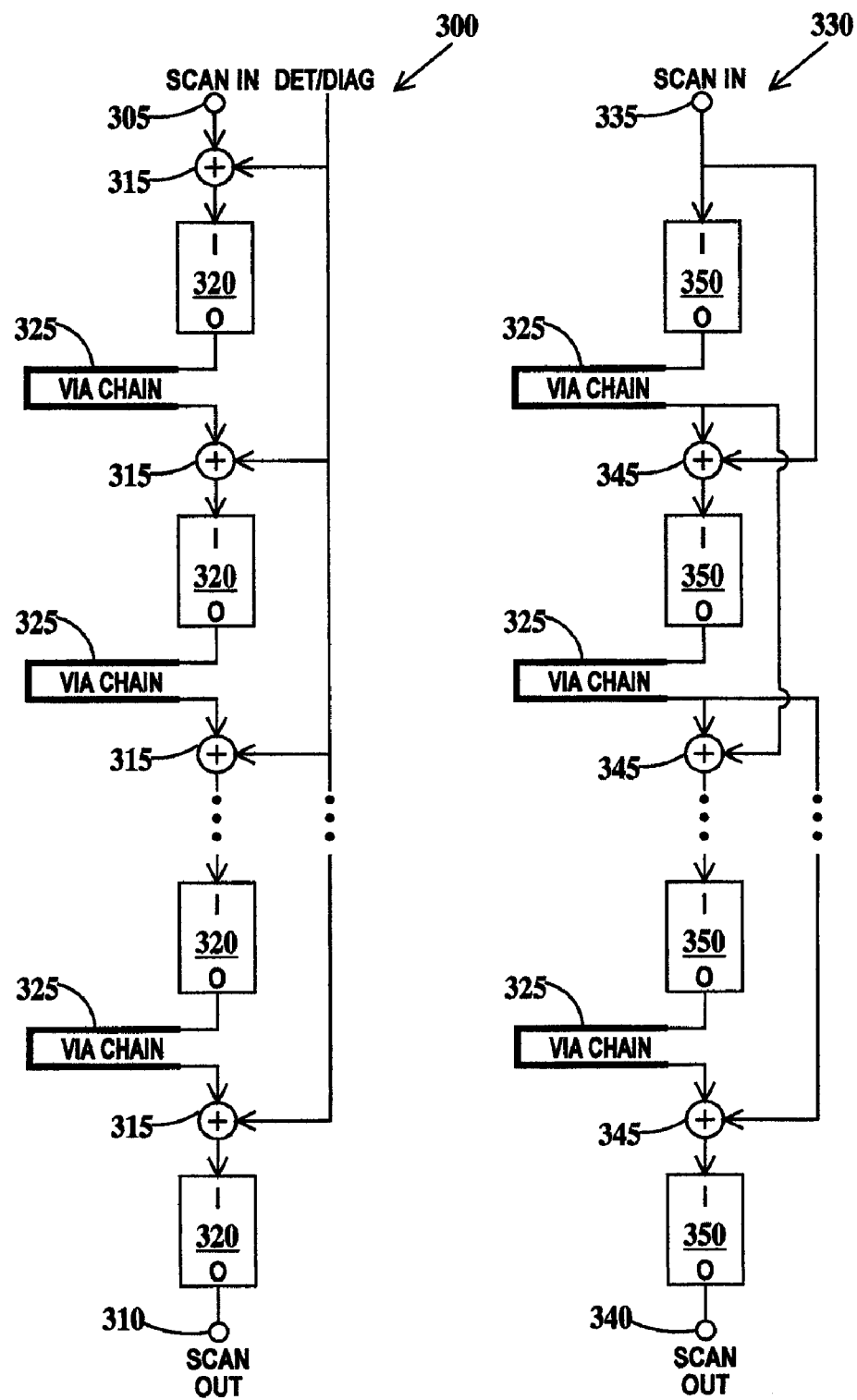
*FIG. 5*  *FIG. 6*

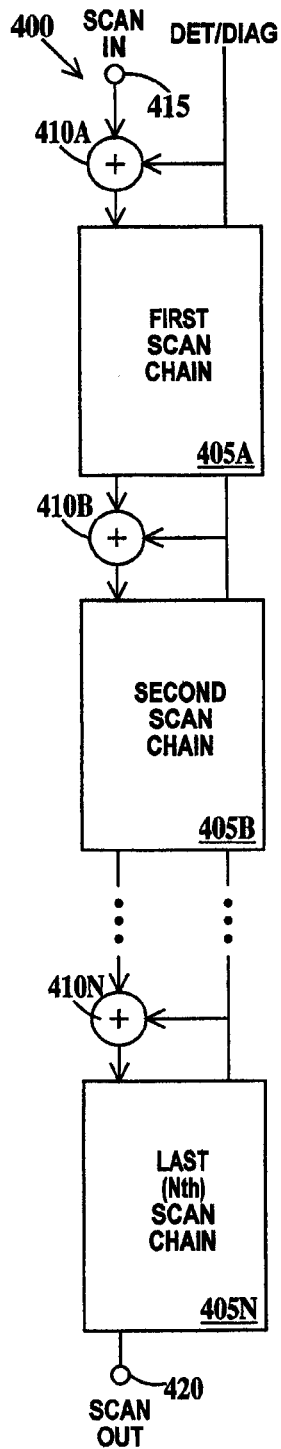
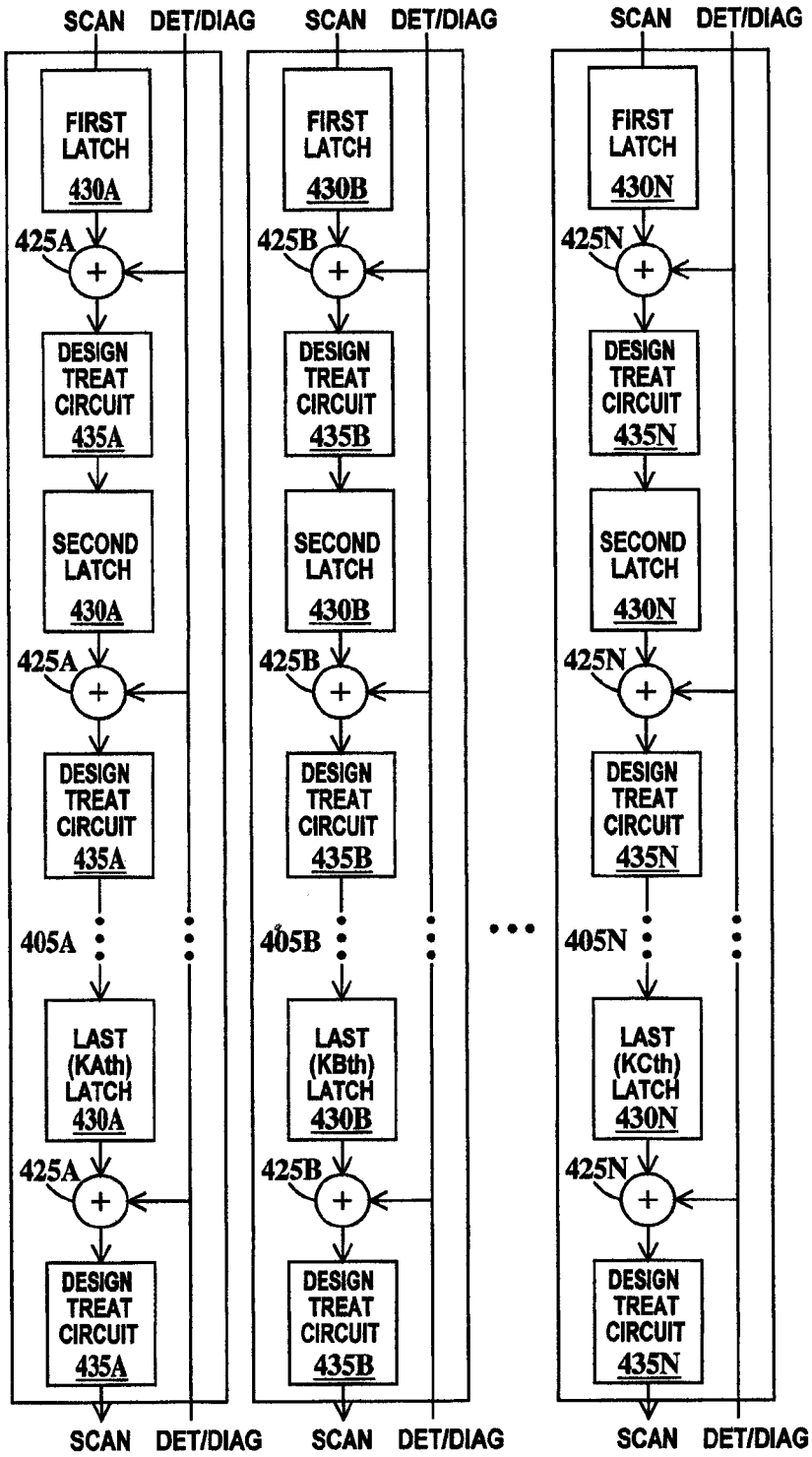
*FIG. 7A*
*FIG. 7B*

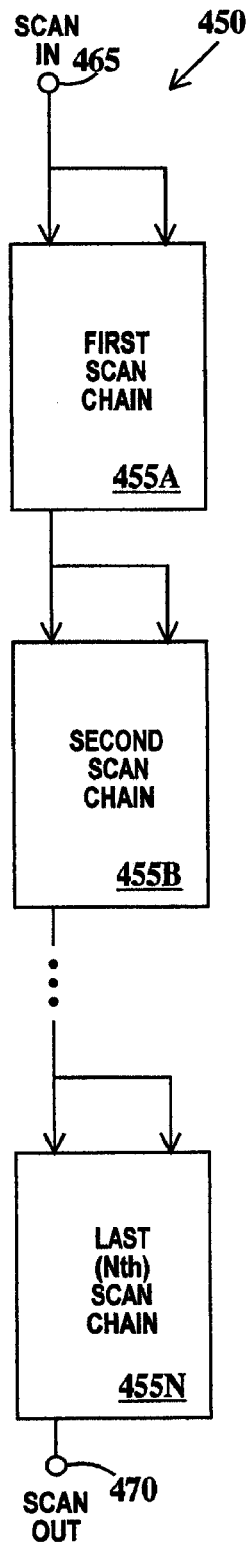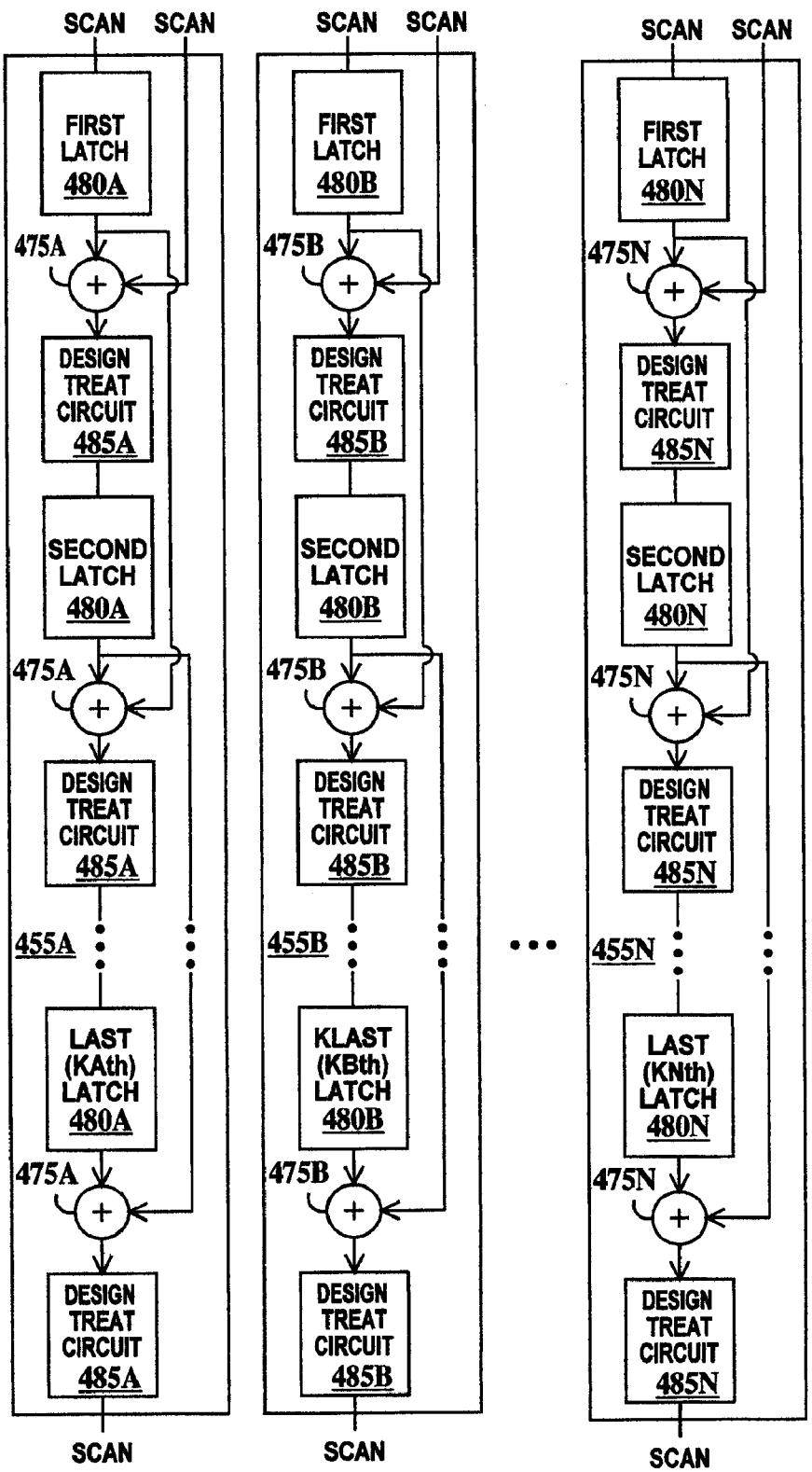
*FIG. 8A*
*FIG. 8B*

CIRCUIT AND METHOD FOR MONITORING DEFECTS

BACKGROUND OF INVENTION

1. Field of the Invention

The present invention relates to the field of defect monitoring; more specifically, it relates to a circuit and method for monitoring defects in integrated circuits.

2. Background of the Invention

Yield management in integrated circuit manufacturing is an ongoing concern and is especially important as new technologies, tools and processes are developed and introduced into manufacturing. As integrated circuits have become more complex, yield learning has become more difficult, especially since current in-line testing strategies, test structures and test circuits do not detect all yield loss mechanisms associated with more complex integrated circuits. Therefore, there is a need for improved defect monitoring circuits, defect monitoring strategies and defect monitoring circuits for detecting yield loss mechanisms.

SUMMARY OF INVENTION

A first aspect of the present invention is a circuit for monitoring defects in an integrated circuit, comprising: a defect monitor comprising a nominally continuous conductor having a length and a multiplicity of conductor segments, each conductor segment having a length, at least a portion of the length of each conductor segment adjacent to a portion of the length of the nominally continuous conductor; a first set of sense elements coupled to the nominally continuous conductor at locations along the length of the nominally continuous conductor located between conductor segments; a second set sense elements coupled to corresponding conductor segments of multiplicity of conductor segments; and gates responsive to a control signal on select inputs of the gates to serially and electrically connect the conductor segments into a nominally electrically continuous conductive path based on a first logical value of the control signal and to electrically disconnect the conductor segments from one another based on a second logical value of the control signal.

A second aspect of the present invention is a method for monitoring defects in an integrated circuit, comprising: providing a defect monitor comprising a nominally continuous conductor having a length and a multiplicity of conductor segments, each conductor segment having a length, at least a portion of the length of each conductor segment adjacent to a portion of the length of the nominally continuous conductor; providing a first set of sense elements; coupling the first set of sense elements to the nominally continuous conductor at locations along the length of the nominally continuous conductor located between conductor segments; providing a second set sense elements; coupling the second set sense elements to corresponding conductor segments of multiplicity of conductor segments; and providing gates responsive to a control signal on select inputs of the gates to serially and electrically connect the conductor segments into a nominally electrically continuous conductive path based on a first logical value of the control signal and to electrically disconnect the conductor segments from one another based on a second logical value of the control signal.

A third aspect of the present invention is a circuit for monitoring defects in an integrated circuit chip, comprising: a scan chain comprising a scan input, a multiplicity of latches coupled in series from a first latch to a last latch and a scan output; a multiplicity of electrically conductive defect monitor structures, each defect monitor structure coupled between different adjacent latches of the scan chain, an input of each defect monitor structure coupled to an output of a previous latch of the scan chain and an output of each defect monitor structure coupled to an input of an immediately subsequent latch of the scan chain; and the scan input coupled to an input of the first latch in the scan chain and the scan output coupled to an output of the last latch in the scan chain.

A fourth aspect of the present invention is a method for monitoring defects in an integrated circuit chip, comprising: providing a scan chain comprising a scan input, a multiplicity of latches coupled in series from a first latch to a last latch and a scan output; providing a multiplicity of electrically conductive defect monitor structures, each defect monitor structure coupled between different adjacent latches of the scan chain, an input of each defect monitor structure coupled to an output of a previous latch of the scan chain and an output of each defect monitor structure coupled to an input of an immediately subsequent latch of the scan chain; and the scan input coupled to an input of the first latch in the scan chain and the scan output coupled to an output of the last latch in the scan chain.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 5 is a first exemplary circuit for monitoring defects according to a second embodiment of the present invention;

FIG. 6 is a second exemplary circuit for monitoring defects according to the second embodiment of the present invention;

FIG. 7A is a first exemplary circuit for implementing a designed experiment according to the present invention;

FIG. 7B is a schematic circuit diagram illustrating the circuits of the scan chains of FIG. 7A;

FIG. 8A is a second exemplary circuit for implementing a designed experiment according to the present invention;

FIG. 8B is a schematic circuit diagram illustrating the circuits of the scan chains of FIG. 8A;

DETAILED DESCRIPTION

Unless otherwise noted all signals, whether data signals, clock signals, control signals, select signals or other types of signals are digital signals switched between a high value (a logical one) and a low value (a logical zero). The term "coupled" is defined as connected but allowing (though not requiring) an intervening element between the elements coupled. The term "functional circuit" means a circuit that is fabricated on an integrated circuit chip to perform a task required in normal operational mode of the integrated circuit chip. The state of a latch is determined by whether the latch is storing a logical one or a logical zero. A latch is an example of a sense element. Another example of a sense element is a sense amplifier on the input of a latch. A scan chain is a set of latches connected in series, the output of a previous latch in the series coupled to the input of an immediately subsequent latch in the series.

Figures 1, 2:
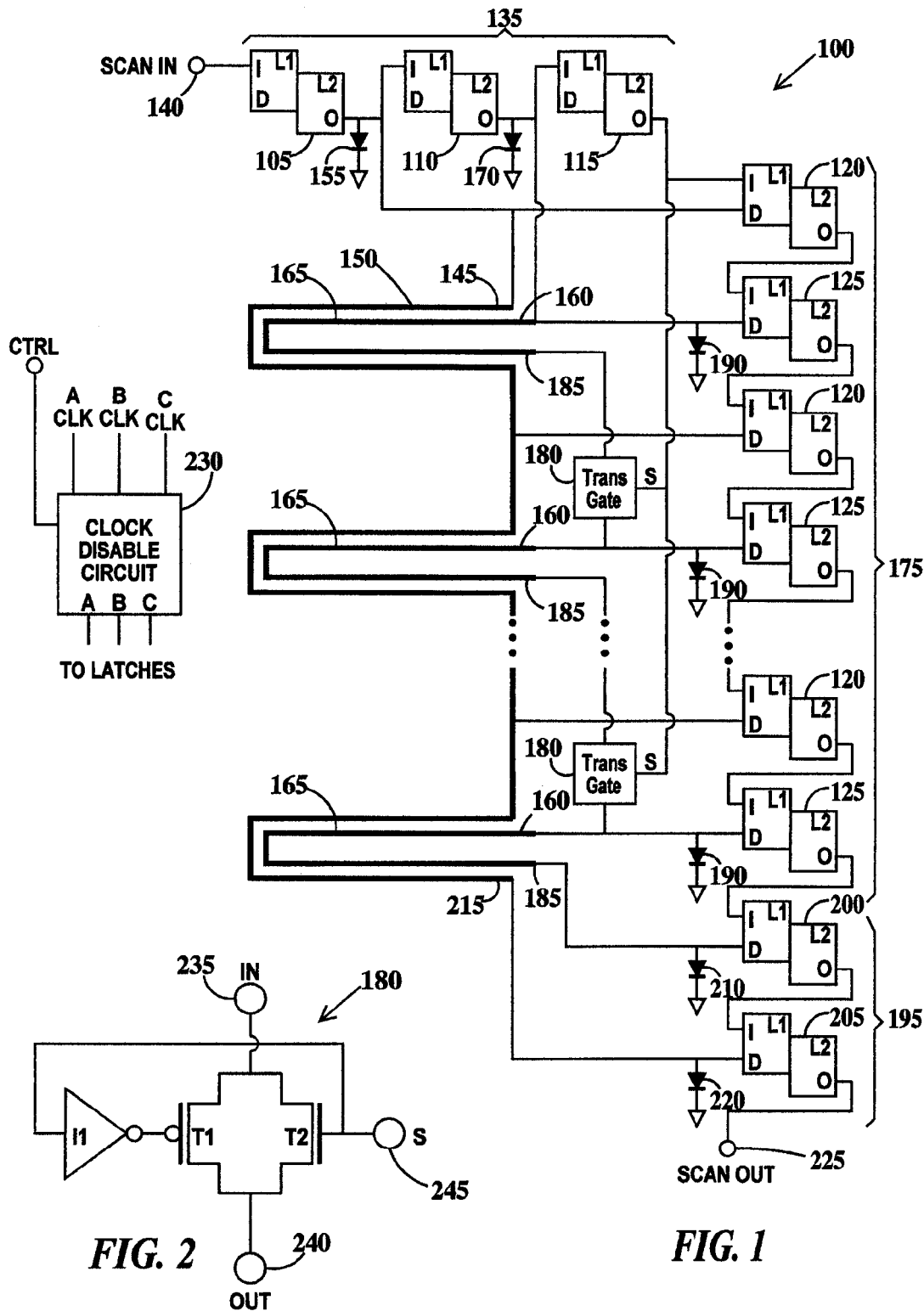
FIG. 1 is a first exemplary circuit for monitoring defects according to a first embodiment of the present invention.
FIG. 2 is a schematic diagram of an exemplary transmission gate.

FIG. 1 is a first exemplary circuit for monitoring defects according to a first embodiment of the present invention. The circuit illustrated in FIG. 1 monitors defects that can cause opens or shorts between conductive power and/or signal wires of an integrated circuit. These wires may be metal wires contained in inter-level dielectric layers fabricated during back-end-of-line (BEOL) processes or wires fabricated during front-end-of-line (FEOL) processing, such as polysilicon wires often used as the gates and gate interconnection wires of field-effect transistors (FETs).

In FIG. 1, a defect monitor circuit 100 includes a scan chain made up of a first setup latch 105, a second setup latch 110, a third setup latch 115, a set of first net latches 120, a set of second net latches 125 a next to last latch 200 and a last latch 205. Latches 105, 110, 115, 120 and 125 are illustrated in FIG. 1 (and FIGS. 3 and 4) as L1/L2 latches, but many other latch types that are well known in the art may be substituted for L1/L2 latches. L1/L2 latches were chosen in order to allow a detailed explanation of how defect monitor circuit 100 operates. Each of latches 105, 110, 115, 120, 125, 200 and 205 have an input port (I), a data port (D) and an output port (O). In addition each of latches 105, 110, 115, 120, 125, 200 and 205 have three clock ports, A, B and C not illustrated. A CLK A signal on a latch's A port allows a signal at the input port to be latched by the L1 portion of the latch. The CLK A signal is known as the scan clock. A CLK B signal on a latch's B port allows data to be shifted from the L1 portion to the L2 portion of the latch. The CLK B signal is known as the shift clock. A CLK C signal on a latch's C port allows a signal at a latch's data port to be latched by the L1 portion of the latch. The CLK C signal is known as the data clock.

Latches 105, 110 and 115 are coupled in series into a first scan chain segment 135. The input port of first setup latch 105 is coupled to a scan in pin 140. The output port of first setup latch 105 is connected to a first end 145 of a nominally continuous conductor 150, the input port of second setup latch 110 and coupled to ground through a diode 155. Nominally continuous conductor 150 is so called because it is designed to be continuous but may actually be broken in one or more places by defects. The output port of second setup latch 110 is connected to a first end 160 of the first segment of a set of sequential conductor segments 165, the input port of third setup latch 115 and coupled to ground through a diode 170. The output port of third setup latch 115 is connected to the input port of the initial latch (which is a first net latch 120) in a second scan chain segment 175 and the switch (S) input of each of transmission gates 180.

Figure 9A:
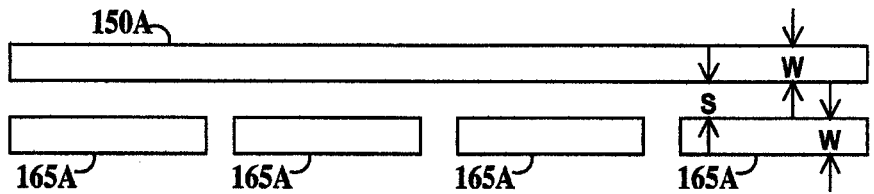
FIG. 9A is a schematic first exemplary layout of a shorts/open monitor structure according to the present invention.
Figure 9B:
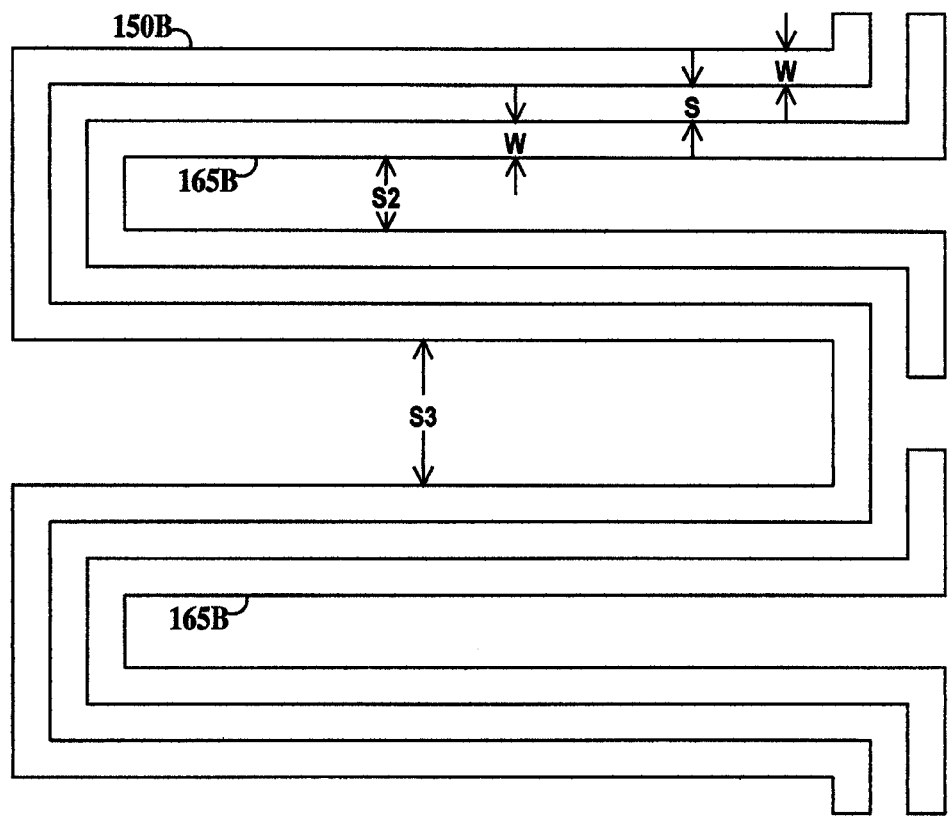
FIG. 9B is a schematic second exemplary layout of a shorts/open monitor structure according to the present invention.

The defect monitor structure of defect monitor circuit 100 is made up of nominally continuous conductor 150 and conductor segments 165 that may be thought of as a second nominally continuous conductor running parallel to and adjacent to nominally continuous conductor 150 for a portion of the length of continuous conductor 150 and that has been broken at several points to create multiple conductor segments 165. Examples of physical layouts of nominally continuous conductor 150 and conductor segments are illustrated in FIGS. 9A and 9B and described infra. Each transmission gate 180 is connected between second ends 185 and first ends 160 of different and immediately following conductor segments 165. Thus transmission gates can connect all conductor segments 160 into a electrically, but not physically, nominally continuous conductor for open testing and leave each conductor segment 165 electrically isolated from each other for shorts testing as described infra.

Second scan chain segment 175 comprises first net latches 120 and second net latches 125 coupled in series in alternating sequence, the initial latch in second scan chain segment 175 being a first net latch 120 and the last latch in second scan chain segment 175 being a second net latch 125. The output port of each first net latch 120 is connected to the input port of an immediately following second net latch 125. The output port of each second net latch 125 is connected to the input port of an immediately following first net latch 120. The data port of each second net latch 125 is connected to first end 160 of a corresponding and different conductor segment 165 and also coupled to ground through a diode 190. In one example diode 190 is a floating gate diode. The data port of each first net latch 120 is connected to a point on nominally continuous conductor 150. The exact connection point is determined by the position of the first net latch 120 in second scan chain segment 175. The data port of the initial first net latch 120 is connected to first end 145 of nominally continuous conductors 150. Data ports of subsequent first net latches 120 are electrically connected to nominally continuous conductor 150 at points physically located between adjacent conductor segments 165.

A third scan chain segment 195 includes next to last latch 200 and last latch 205. The input port of next to last latch 200 is coupled to the output port of the last second net latch 125 of second scan chain segment 175. The data port of next to last latch 200 is connected to second end 185 of the last segment of the set of sequential conductor segments 165 and coupled to ground through a diode 210. The output port of next to last latch 200 is coupled to the input port of last latch 205. The data port of last latch 205 is connected to a second end 215 of nominally continuous conductor 150 and coupled to ground through a diode 220. The output port of last latch 205 is coupled to a scan out pin 225.

Diodes 190, 210 and 225 may be replaced by devices such as transistors, pass gates, transmission gates or other switching devices or combinations thereof as long as the latch coupled to the device can overdrive the device.

Defect monitor circuit 100 further includes an optional clock disconnect circuit 230 which will couple the clock inputs of latches 105, 110, 115, 120, 125, 200 and 205 to the off states of the A CLK, B CLK and C CLK signals. Normally the off state of the A CLK, B CLK and C CLK signals is low which may or may not be circuit or chip ground. The off state of the A CLK, B CLK and C CLK signals may or may not be the same in either magnitude or polarity.

The combination of alternating first net latches 120 being connected to points on nominally continuous conductor 150 physically located on different sides of conductor segments 165 and alternating second net latches 125 being connected to different conductor segments imparts a granularity to the data scanned out of the scan chain comprised of first, second and third scan chain segments 135, 175 and 195. This granularity allows determination of the location of defect causing a short or open to the physical area around a single conductor segment and thus makes the task of failure analysis much easier.

While a polarity of VDD high and ground low has been assumed in the description of defect monitor circuit 100, the polarity may be reversed with VSS low and ground high. It should be noted that second net latches 125 are always coupled to conductor segments 165 and first net latches 130 are always coupled to nominally continuous conductive line 150. Since first setup latch 105 and last latch 205 are coupled to nominally continuous conductive line 150, first net latches 120, first setup latch 105 and last latch 205 may be considered to belong to a first set of latches. Since second setup latch 110 and next to last latch 200 are coupled to nominally continuous conductive line 150, second net latches 125, second setup latch 110 and next to last latch 210 may be considered to belong to a second set of latches.

FIG. 2 is a schematic diagram of transmission gate 180 of FIG. 1. In FIG. 2 the sources/drains of a PFET T1 and of an NFET T2 are connected to an input pin 235 and second source/drains of PFET T1 and NFET T2 are connected to an output pin 240. The gate of NFET T2 is connected to a switch pin 245 and to an input of an inverter 11. The output of inverter 11 is coupled to the gate of PFET T1. Transmission gates are used in the present invention since transmission gates will pass all of the voltage level of signal applied to input pin 235 without dropping the voltage level by $V_t$ (threshold voltage) when passing a logical 0 through a PFET or a logical 1 through an NFET. Though pass gates may be substituted, they would not be as efficient and the latch would be more prone to not latching small voltage level shifts caused by high resistance shorts or opens.

Figure 3:
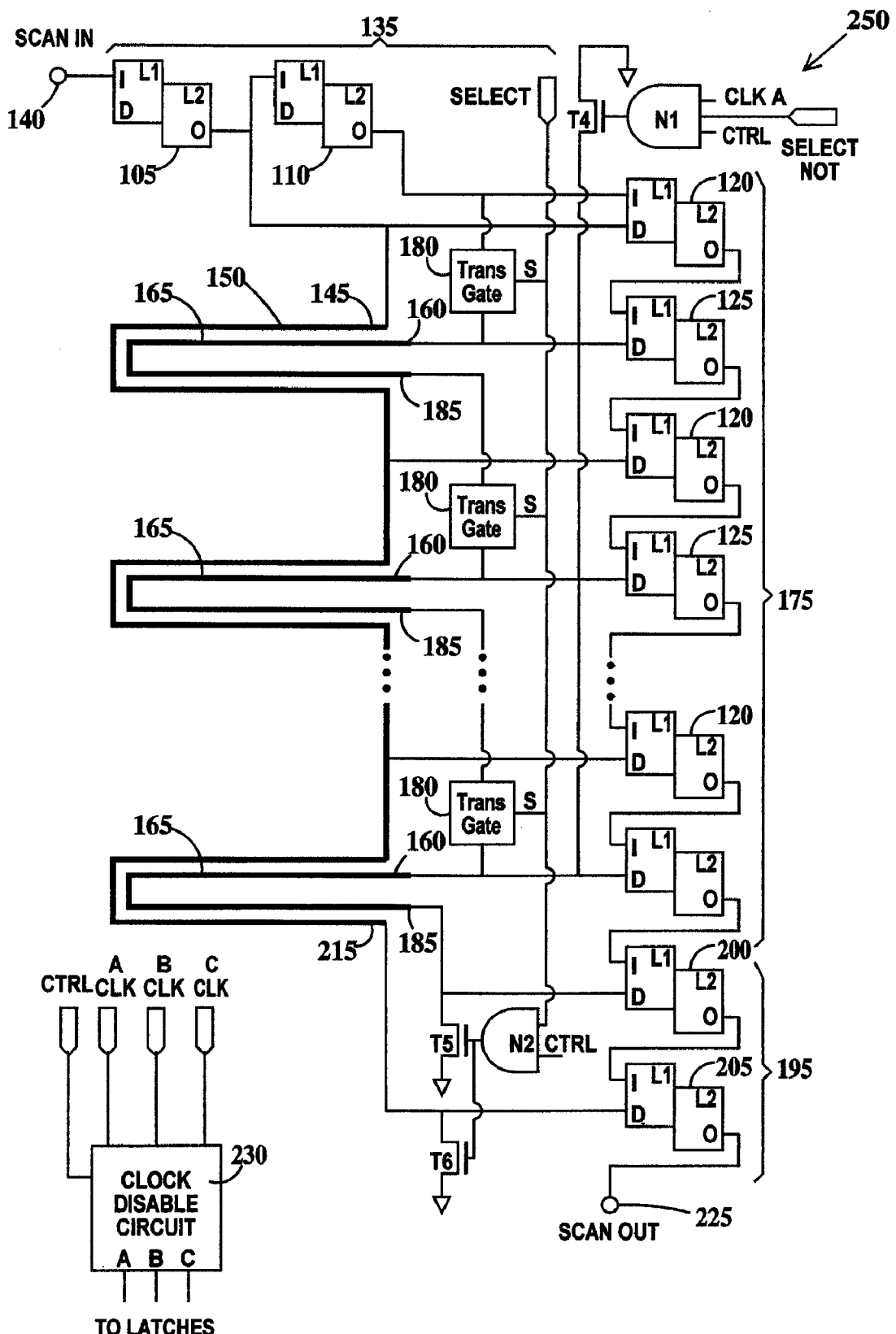
FIG. 3 is a second exemplary circuit for monitoring defects according to a first embodiment of the present invention.

FIG. 3 is a second exemplary circuit for monitoring defects according to a first embodiment of the present invention. In FIG. 3, a defect monitor circuit 250 is similar to defect monitor circuit 100 of FIG. 1, except for three differences. The first difference is third setup latch 115 (see FIG. 1) is replaced by a select signal input pin SELECT. Note, this change may be made to defect monitor circuit 100 of FIG. 1 and defect monitor circuit 260 of FIG. 4 (described infra) as well. Thus, the output of second setup latch is connected to the input port of the first latch of the set of first net latches 120. The second difference is diodes 155 and 170 of FIG. 1 are removed and diode 190 of FIG. 1 is replaced by connections to the source of a pre-charge NFET T4 whose drain is connected to ground and whose gate is connected to the output of an AND gate N1. A first input of AND gate N1 is connected to a CLK A signal, a second input of AND gate N1 is connected to a SELECT NOT pin and a third input of AND gate N1 is connected to CTRL. That is, the data ports of second net latches 125 are connected to the source of NFET T4. The third difference is diode 210 of FIG. 1 is replaced by an NFET T5 and diode 220 of FIG. 1 is replaced by an NFET T6. The source of NFET T5 is connected to the data port of next to last latch 200 (and thus also to second end 185 of the last conductor segment 165).

The source of NFET T6 is connected to the data port of last latch 205 (and thus also to second end 215 of nominally continuous conductor 150). The drains of NFETs T5 and T6 are connected to ground and the gates of NFETs T5 and T6 are connected to the output of an AND gate N2. A first input of AND gate N2 is connected to a SELECT pin and a second input of AND gate N2 is connected to CTRL.

For shorts testing, SELECT is set to logical 0 and for opens testing SELECT is set to logical 1. AND gates N1 and N2 ensure that all current paths are disabled when defect monitor circuit 260 is off. In shorts testing, whenever there is a logical 1 on the gate of NFET T4, each conductor segment 165 will be precharged low through NFET T4 to ground.

Figure 4:
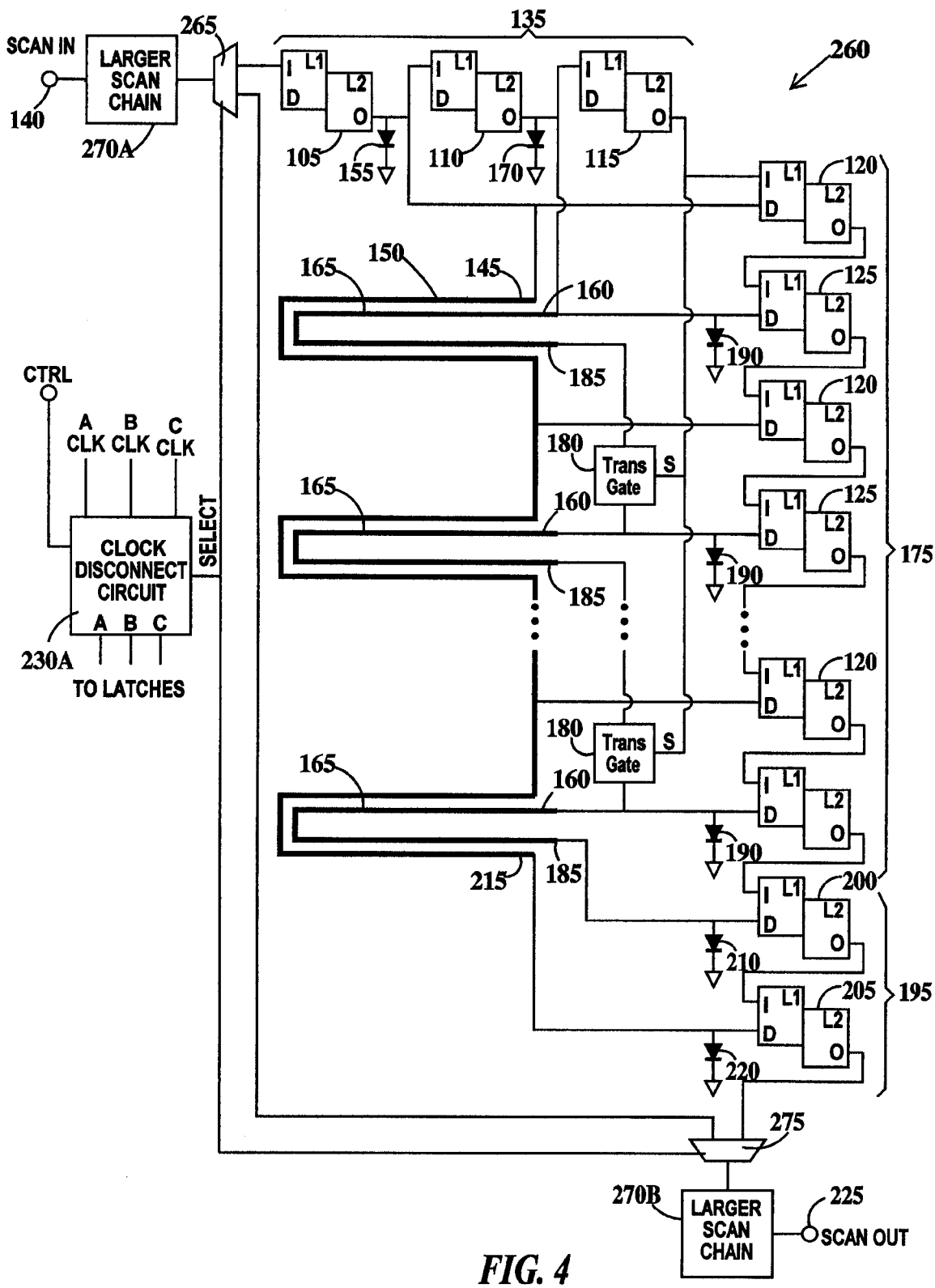
FIG. 4 is a third exemplary circuit for monitoring defects according to a first embodiment of the present invention.

FIG. 4 is a third exemplary circuit for monitoring defects according to a first embodiment of the present invention. In FIG. 4, a third defect monitor circuit 260 provides for inclusion of the scan chain comprised of latches 105, 110, 115, 120, 125, 200, and 205 to be incorporated into a larger scan chain that may be used for other functions such as combinational logic testing in order to save chip pin count, tester channels, etc. In a first example, the larger scan chain may be a scan chain designed for combinational logic diagnosis, examples of which are well known in the art. In a second example, the larger scan chain may be one or more defect monitor circuits 100 and/or 250.

Defect monitor circuit 260 is similar to defect monitor circuit 100 of FIG. 1, except for three differences. First, demultiplexer 265 has been inserted into the path between a first segment 270A of a larger scan chain and the scan chain comprising latches 105, 110, 115, 120, 125, 200, 225, and a multiplexer 275 has been inserted between the scan chain comprising latches 105, 110, 115, 120, 125, 200 and 225 and a second segment 270B of the larger scan chain. The input of a last latch of first portion 270A of the larger scan chain is connected to the input of demultiplexer 270A. A first output of de-multiplexer 265 is connected to the input port of first setup latch 105 and second output of de-multiplexer 270A is connected to a second input of multiplexer 275. The output port of last latch 205 is connected to a first input of multiplexer 275 and the output of multiplexer 275 is connected to the input port of the first latch of second segment 270B of the larger scan chain. Second, scan in pin 140 is connected to the input port of the first latch of first portion 270A of larger scan chain and scan out pin 225 is connected to the output port of the last latch of second portion 270B of the larger scan chain. If there is no first portion 270A then scan in pin 140 is connected to the input of demultiplexer 265. If there is no second portion 270B then scan out pin 225 is connected to the output of multiplexer 275. Third, either a modified optional clock disconnect circuit 230A adapted to generate a SELECT signal is included (illustrated in FIG. 4) or a SELECT signal is provided from another circuit or pin (not illustrated in FIG. 4). The select or switch inputs of de-multiplexer 265 and multiplexer 275 are connected to the SELECT signal.

A fourth exemplary circuit for monitoring defects according to a first embodiment of the present invention substitutes defect monitor circuit 250 for defect monitor circuit 100 in the description of defect monitoring circuit 260 supra, using a precharge scheme instead of floating gate diodes.

There are three modes of operation for defect monitor circuits 100, 250 and 260. In the first or standby mode defect monitor circuit 100, 250 or 260 is placed in a state where no measurement is being made. In the second or shorts testing mode, defect monitor circuit 100, 250 or 260 is first placed in a state where shorts testing can be performed and then the actual shorts test data is collected. In the third or opens testing mode, defect monitor circuit 100, 250 or 260 is first placed in a state where opens testing can be performed and then the actual opens test data is collected.

In standby mode the steps are as follows (reference should be made to FIG. 1, 3 or 4): (1) Scan in logical 0 into all latches 105, 110, 115, 120, 125, 200 and 205. This also turns transmission gates 180 off. (2) Optionally disconnect the clock inputs of 105, 110, 115, 120, 125, 200 and 205 and tie the clock inputs of 105, 110, 115, 120, 125, 200 and 205 to the respective low state of each clock signal. (3) In the case of defect monitor circuit 260, bypass the portion of the larger scan chain comprised of latches 105, 110, 115, 120, 125, 200 and 205 by application of the SELECT signal to de-multiplexer 265 and multiplexer 275 (see FIG. 4).

In the second or shorts testing mode the steps are as follows (reference should be made to FIG. 1, 3 or 4: (1) In the case of defect monitor circuit 260, reconnect the portion of the scan chain comprised of latches 105, 110, 115, 120, 125, 200 and 205 to the larger scan chain by application of the SELECT signal to de-multiplexer 265 and multiplexer 275 (see FIG. 4). (2) Scan in a logical 1 into latch 105, logical 0s into latches 105, 115, 120, 125, 200 and 205 and a logical 1 on latch 110. This is accomplished by alternating A CLK and B CLK pulses. A logical 1 on first setup latch 105 brings nominally continuous conductor 150 high (for example, to VDD). A logical 0 on second setup latch 110 and on third setup latch 115 by turning off transmission gates 180, allows all conductor segments 165 to initially float since the data input of a second net latches 125 has a high enough resistance to be considered an open. However, diodes 190 will couple all conductor segments 165 to ground. (3) An amount of time is allowed to pass in order for the latch states to stabilize. (4) The C CKL is pulsed in order to capture the logical state of nominally continuous conductor 150 and each conductor segment 165. First net latches 120 capture the logical state of nominally continuous conductor 150 are various points along it length and second net latches 125 capture the logical state of each conductor segment 165. (5) The B CLK is pulsed to scan out the data captured by first net latches 120 and second net latches 125. Whether or not there are any shorts between nominally continuous conductor 150 and any conductor segment 165, all first net latches 120 will contain a logical 1. If there are no shorts between nominally continuous conductor 150 and conductor segments 165, all second net latches 125 will contain a logical 0. If there are shorts between nominally continuous conductor 150 and any conductor segment 165, those second net latches 125 connected to a conductor segment 165 shorted to nominally continuous conductor 150 will contain a logical 1 since diodes 190 are not sufficient to pull conductor segments 165 to ground when sourced from latch 105 and those second net latches 125 connected to a conductor segment 165 not shorted to nominally continuous conductor segment 150 will contain a logical 0.

In the third or opens testing mode the steps are as follows (reference should be made to FIG. 1, 3 or 4): (1) In the case of defect monitor circuit 260, reconnect the portion of the scan chain comprised of latches 105, 110, 115, 120, 125, 200 and 205 to the larger scan chain by application of the SELECT signal to de-multiplexer 265 and multiplexer 275 (see FIG. 4). (2) Scan in logical 1 on latches 105, 110 and 115 and a logical 0 on latches 120, 125 200 and 205. This is accomplished by alternating A CLK and B CLK pulses. A logical 1 on third setup latch 115 turns on transmission gates 180 electrically connecting all conductor segments 165. A logical 1 on first setup latch 105 brings nominally continuous conductor 150 high (for example, to VDD) and a logical 1 on second setup latch 110 brings all conductor segments high (for example, to VDD. (3) An amount of time is allowed to pass in order for the latch states to stabilize. (4) The C CKL is pulsed in order to capture the logical state of nominally continuous conductor 150 and each conductor segment 165. First net latches 120 capture the logical state of nominally continuous conductor 150 are various points along it length and second net latches 125 capture the logical state of each end 160 of each nominally and serially connected conductor segments 165. (5) Scan clocks are pulsed to scan out the data captured by first net latches 120 and second net latches 125. If there are no opens in nominally continuous conductor 150 or the nominally continuous path through conductor segments 165, all first net latches 120 will contain a logical 1 and all second net latches 125 will contain a logical 1. If there are opens in nominally continuous conductor 150 all first net latches 120 downstream of the open will contain a logical 0. If there are opens in a particular conductor segment 165, second net latches 125 whose data ports are connected to those conductor segments 165 downstream of the open conductor segment will contain a logical 0.

It should be noted that opens testing of just nominally continuous conductor 150 can be performed by placing a logical 1 in first setup latch 105, a logical 0 in second setup latch 110 and a logical 1 in third setup latch 115 and opens testing of just the nominally continuous path through conductor segments 165 can be performed by placing a logical 0 in first setup latch 105, a logical 1 in second setup latch 110 and a logical 1 in third setup latch 115.

FIG. 5 is a first exemplary circuit for monitoring defects according to a second embodiment of the present invention. In FIG. 5, a defect monitor circuit 300 includes a scan in pin 305, a scan out pin 310, a multiplicity of XOR gates 315, a multiplicity of latches 320 and a multiplicity of via chains 325. XOR gates 315 and latches 320 are coupled in series, one latch 320 alternating with one XOR gate 315 starting with an XOR gate and ending with a latch. A first input of the first XOR gate 315 is connected to scan in pin 305. The output of each XOR gate 315 is connected to the input port of an immediately following latch 320. The output port of each latch 320 is coupled to the first input of an immediately following XOR gate through a via chain 325. The output of the last latch 320 is connected to scan out pin 310. A second input of each XOR gate 315 is connected to a detect/diagnose (DET/DIAG) signal. An open via in any via chain 325 will generate a stuck at 0 fault assuming VDD is high and ground is low.

Defect monitor circuit 300 is a first example of a class of scan chain circuits that are diagnosable scan chains. A diagnosable scan chain is defined as a scan chain comprised of latches and additional circuit elements interconnected to allow the determination of the latch or latches at which stuck at faults have occurred. The determination of the failing latch may utilize input of predetermined bit patterns, analysis of resultant output bit patterns or both. The input bit patterns may be a function of the output bit pattern at any or at periodic clock cycles during the test and/or diagnosis phase of operation. The length (number of clock cycles) of testing overall or of any sub division of the testing may be a function of the output bit pattern as well.

The operation of the defect monitor circuit 300 is complex and includes detection of fault phases and diagnosis phases. The operation of defect monitor circuit is described in detail in Samantha Edirisooriya's, "Diagnosis of Scan Path Failures", IEEE 250, 255 (1995), which is hereby incorporated in its entirety by reference.

FIG. 6 is a second exemplary circuit for monitoring defects according to the second embodiment of the present invention. In FIG. 5, a defect monitor circuit 330 includes a scan in pin 335, a scan out pin 340, a multiplicity of XOR gates 345, a multiplicity of latches 350 and a multiplicity of via chains 325. XOR gates 345 and latches 350 are coupled in series, one latch 350 alternating with one XOR gate 345 starting with an latch and ending with a latch. The input port of the first latch 350 is connected to scan in pin 335. The output of each XOR gate 345 is connected to the input port of an immediately following latch. The output port of each latch 350 is coupled to the first input of an immediately following XOR gate 345 through a via chain 325. The output of the last latch 350 is connected to scan out pin 340. A second input of each XOR gate 345 is connected to the input of the immediately previous XOR gate 345 except the first XOR gate 345 is connected to scan in pin 335. An open via in any via chain 325 will generate a stuck at 0 fault assuming VDD is high and ground is low.

Defect monitor circuit 330 is a second example of the class of scan chain circuits that are diagnosable scan chains. The operation of the defect monitor circuit 330 is complex and includes use of a fault dictionary. The operation of defect monitor circuit is described in detail in Geetani Edirisooriya's, "can Chain Fault Diagnosis with Fault Dictionaries," IEEE 1912, 1915 (1995), which is hereby incorporated in its entirety by reference.

Figure 10:
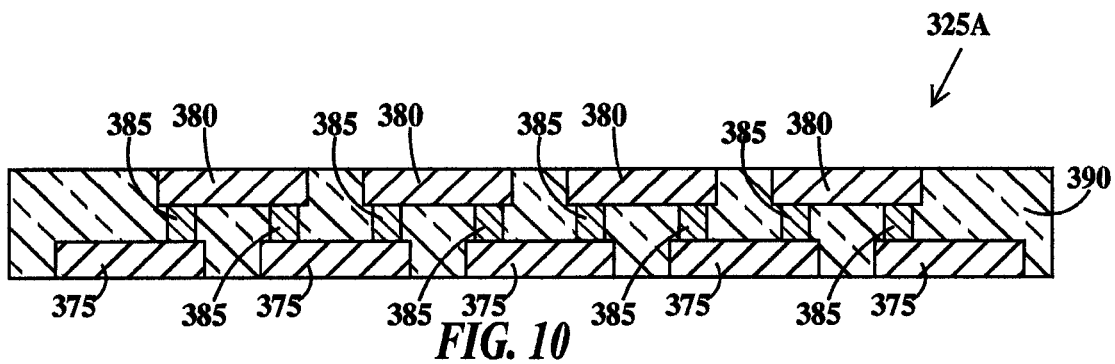
FIG. 10 is a cross-sectional of an exemplary via chain according to the present invention.

For both defect monitor circuit 300 of FIG. 5 and defect monitor circuit 330 of FIG. 6, an example of a via chain structure is illustrated in FIG. 10 and described infra. The overall area of vias in all chains must be large enough ensure detection of defects at predetermined sizes and densities. The number chains must be large enough to give a required granularity of location but not so large as to take up extensive real-estate on a chip or require large amounts of time for testing and analysis to determine fault locations.

Note, each via chain may be identical or may be different, incorporating different via sizes, interconnect wire thicknesses and widths and materials. Further, via chains inserted in the scan chain path between latches of the scan chain should be considered exemplary and other defect monitor structures may be inserted in place of via chains.

Defect monitor circuits 300 and 330 may be used to implement designed experiments. A designed experiment is defined as an experiment wherein integrated circuit process parameters, design parameters, performance parameter or combinations thereof (called treatments) are tested. An example of a three factor design experiment is illustrated in TABLE I, where the first factor is the usage of a first metal (M1) interconnect level length of wiring in a circuit, the second factor is the usage of a second metal (M2) interconnect level length of wiring in the circuit and the third factor is the type of latch used in the circuit.

TABLE I

| Treatment | M1 Length | M2 Length | Latch Type |
|---|---|---|---|
| 1 | below average | below average | A |
| 2 | below average | below average | B |
| 3 | below average | above average | A |
| 4 | below average | above average | B |
| 5 | above average | below average | A |
| 6 | above average | below average | B |
| 7 | above average | above average | A |

TABLE I-continued

| Treatment | M1 Length | M2 Length | Latch Type |
|---|---|---|---|
| 8 | above average | above average | B |
| 9 | average | average | A&B |
| 10 | average | average | A&B |
| 11 | average | average | A&B |

Table I illustrates a "full factorial" design wherein the first eight treatments are "biased" treatment combinations and the last three treatments are "nominal" treatments. Other types of experimental designs such as fractional factorial, three-level factorial (3$k$) and mixed level factorial may be employed and any number of factors may be checked.

FIG. 7A is a first exemplary circuit for implementing a designed experiment according to the present invention. In FIG. 7A, a test circuit 400 includes a first scan chain 405A, a second scan chain 405B and additional scan chains through a last scan chain 405N. A first input of a first XOR gate 410A is connected to a scan in pin 415 and the output of first XOR gate 410A is connected to first scan chain 405A. A first input of a second XOR gate 410B is connected to first scan chain 410A and the output of second XOR gate 410B is connected to second scan chain 405B. Additional XOR gates are similarly connected between additional scan chains until a last XOR gate 410N is connected to last scan chain 405N. Last scan chain 410N is connected to a scan out pin 420. A DET/DIAG signal is connected to a second input of each XOR gate 410A through 410N and each scan chain 405A through 405N. In the example of TABLE I, there would be one scan chain for each treatment combination, or eleven scan chains.

FIG. 7B is a schematic circuit diagram illustrating the circuits of the scan chains of FIG. 7A. In FIG. 7B, first scan chain 405A includes a multiplicity of XOR gates 425A, a multiplicity of latches 430A and a multiplicity of design treatment circuits 435A. XOR gates 425A and latches 430A are coupled in series, one latch 430A alternating with one XOR gate 425A starting with a latch and ending with a latch. A first input of the first XOR gate 425A is connected to the output port of the first latch 430A. The output of each XOR gate 425A is connected to the input port of an immediately following latch 430A. The output port of each latch 430A of coupled to the first input of an immediately following XOR gate through design treatment circuit 435A. In the Example of TABLE 1, design treatment circuits 435A would correspond to treatment 1 and include a circuit comprising below a average length of M1, a below average length of M2 and type A latches. There are KA design treatment circuits 435A, the number chosen to ensure a high enough probability of fail for the experimental design experiment implemented to be meaningful. A second input of each XOR gate 425A is connected to the DET/DIAG signal.

In FIG. 7B, second scan chain 405B includes a multiplicity of XOR gates 425B, a multiplicity of latches 430B and a multiplicity of design treatment circuits 435B. XOR gates 425B and latches 430B are coupled in series, one latch 430B alternating with one XOR gate 425B starting with a latch and ending with a latch. A first input of the first XOR gate 425B is connected to the output port of the first latch 430B. The output of each XOR gate 425B is connected to the input port of an immediately following latch 430B. The output port of each latch 430B of coupled to the first input of an immediately following XOR gate through design treatment circuit 435B. In the Example of TABLE 1, design treatment circuits 435B would correspond to treatment 2 and include a circuit comprising a below average length of M1, a below average length of M2 and type B latches. There are KB design treatment circuits 435B, the number chosen to ensure a high enough probability of fail for the experimental design experiment implemented to be meaningful. A second input of each XOR gate 425B is connected to the DET/DIAG signal.

In FIG. 7B, last scan chain 405N includes a multiplicity of XOR gates 425N, a multiplicity of latches 430N and a multiplicity of design treatment circuits 435N. XOR gates 425N and latches 430N are coupled in series, one latch 430N alternating with one XOR gate 425N starting with a latch and ending with a latch. A first input of the first XOR gate 425N is connected to the output port of the first latch 430N. The output of each XOR gate 425N is connected to the input port of an immediately following latch 430N. The output port of each latch 430N of coupled to the first input of an immediately following XOR gate through design treatment circuit 435N. In the Example of TABLE 1, design treatment circuits 435N would correspond to treatment 11 and include a circuit comprising an average length of M1, an average length of M2 and type A and type B latches. There are KN design treatment circuits 435N, the number chosen to ensure a high enough probability of fail for the experimental design experiment implemented to be meaningful. A second input of each XOR gate 425N is connected to the DET/DIAG signal.

Returning to FIG. 7A, the operation of test circuit 400 is the same as the operation of defect monitor circuit 300 illustrated in FIG. 5 and described supra. The results from test circuit 400 provide the independent yields of each of the treatment combinations of the designed experiment. Commonly known statistical methods can be applied to these data to determine which of the factors under examination cause yield loss.

FIG. 8A is a second exemplary circuit for implementing a designed experiment according to the present invention. In FIG. 8A, a test circuit 450 includes a first scan chain 455A, a second scan chain 455B and additional scan chains through a last scan chain 455N coupled together in series. A scan in pin 465 is connected to first scan chain 455A. Last scan chain 455N is connected to a scan out pin 470. In the example of TABLE I, there would be one scan chain for each treatment combination, or eleven scan chains.

FIG. 8B is a schematic circuit diagram illustrating the circuits of the sets of scan chains of FIG. 8A. In FIG. 8B, first scan chain 455A includes a multiplicity of XOR gates 475A, a multiplicity of latches 480A and a multiplicity of design treatment circuits 485A. XOR gates 475A and latches 480A are coupled in series, one latch 480A alternating with one XOR gate 475A starting with a latch and ending with a latch. The output of each XOR gate 475A is connected to the input port of an immediately following latch. The output port of each latch 480A is coupled to the first input of an immediately following XOR gate 475A through a design treatment circuit 485A. A second input of each XOR gate 475A is connected to the input of the immediately previous XOR gate 475A. In the Example of TABLE 1, design treatment circuits 435A would correspond to treatment 1 and include a circuit comprising a below average length of M1, a below average length of M2 and type A latches. There are KN design treatment circuits 485A, the number chosen to ensure a high enough probability of fail for the experimental design experiment implemented to be meaningful.

In FIG. 8B, second scan chain 455B includes a multiplicity of XOR gates 475B, a multiplicity of latches 480B and a multiplicity of design treatment circuits 485B. XOR gates 475B and latches 480B are coupled in series, one latch 480B alternating with one XOR gate 475B starting with a latch and ending with a latch. The output of each XOR gate 475B is connected to the input port of an immediately following latch. The output port of each latch 480B is coupled to the first input of an immediately following XOR gate 475B through a design treatment circuit 485B. A second input of each XOR gate 475B is connected to the input of the immediately previous XOR gate 475B. In the Example of TABLE 1, design treatment circuits 435B would correspond to treatment 1 and include a circuit comprising a below average length of M1, a below average length of M2 and type B latches. There are KB design treatment circuits 485B, the number chosen to ensure a high enough probability of fail for the experimental design experiment implemented to be meaningful.

In FIG. 8B, last scan chain 455N includes a multiplicity of XOR gates 475N, a multiplicity of latches 480N and a multiplicity of design treatment circuits 485N. XOR gates 475N and latches 480N are coupled in series, one latch 480N alternating with one XOR gate 475N starting with a latch and ending with a latch. The output of each XOR gate 475N is connected to the input port of an immediately following latch. The output port of each latch 480N is coupled to the first input of an immediately following XOR gate 475N through a design treatment circuit 485N. A second input of each XOR gate 475N is connected to the input of the immediately previous XOR gate 475N. In the Example of TABLE 1, design treatment circuits 435N would correspond to treatment 1 and include a circuit comprising a below average length of M1, a below average length of M2 and type N latches. There are KN design treatment circuits 485N, the number chosen to ensure a high enough probability of fail for the experimental design experiment implemented to be meaningful.

Returning to FIG. 8A, the operation of test circuit 450 is the same as the operation of defect monitor circuit 330 illustrated in FIG. 6 and described supra. The results from test circuit 450 provide the independent yields of each of the treatment combinations of the designed experiment. Commonly known statistical methods can be applied to these data to determine which of the factors under examination cause yield loss.

FIG. 9A is a schematic first exemplary layout of a shorts/open monitor structure according to the present invention. In FIG. 9A, a physical nominally continuous conductor 150A has a width "W" and is spaced a distance "S" from a set of physical conductor segments 165A each having a width "W." Distance "S" may be selected based on a size of the defects to be detected. Not all conductor segments 165A need be spaced the same distance "S" from nominally continuous conductor 150A. All conductor segments 165A are parallel to continuous conductor 150A. In one example "W" is the minimum groundrule linewidth "S" is the minimum groundrule space between lines for the interconnect level of continuous conductor 150A and conductor segments 165A. Many other short/open monitor layout are possible.

FIG. 9B is a schematic second exemplary layout of a shorts/open monitor structure according to the present invention. In FIG. 9B, a nominally continuous serpentine conductor 150B has a width "W" and is spaced a distance "S" from a set of U-shaped physical conductor segments 165B each having a width "W." In a middle portion of serpentine conductor 150B where there is no conductor segment 165B, serpentine conductor 150B is spaced a distance "S3" from itself. The interior distance of the arms of the "U" of each conductor segment 165B are spaced apart a distance "S2." In one example "W" is the minimum ground rule line width, "S" is the minimum groundrule space between lines for the interconnect level of serpentine conductor 150B, conductor segments 165B and "S2" and "S3" are a larger than minimum spacing so as to make internal shorting of serpentine conductor 150B and conductor segments 165B and other internal wiring unlikely. Many other short/open monitor layout configurations are possible.

Note it is not necessary that the nominally continuous conductor be an integral unit, but could comprise segments (at the same interconnect level as the conductor segments) joined together by conductor segments on a lower or higher interconnect level, similar to a via string, though open faults in the vias would be problematical.

FIG. 10 is a cross-sectional of an exemplary via chain according to the present invention. In FIG. 10, a via chain structure 325A includes a set of lower level conductor segments 375, a set of upper level conductor segments 380 connected by conductive vias 385. Conductive vias 385 are arranged so that a serial electrically conductive path from first lower wire segment 375, through a first via 385 into a first upper wire segment 380, through a second via into a second lower wire segment 375 etc. exists. Generally wire segments 375 and 380 and via 385 are formed in a dielectric material 390.

Figure 11:
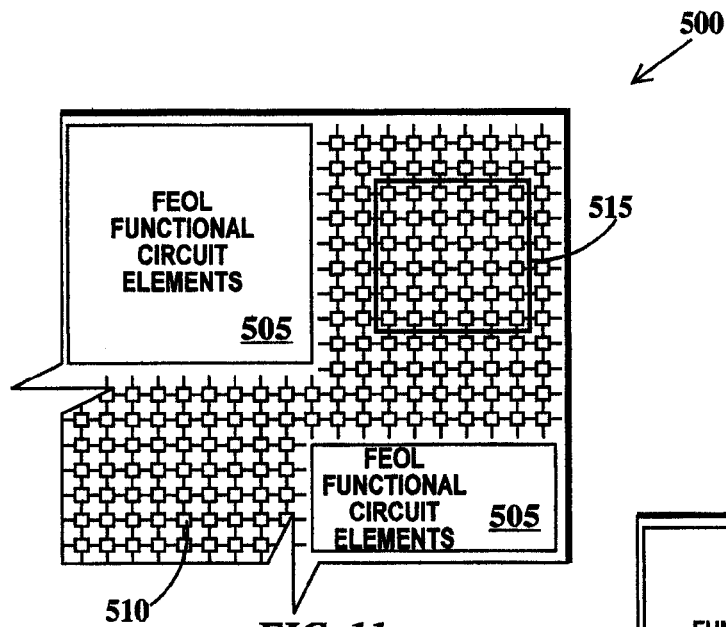
FIG. 11 is a plan view of the front-end-of-line levels of an integrated circuit chip illustrating a first method of integrating the present invention into an integrated circuit chip.

FIG. 11 is a plan view of the FEOL levels of an integrated circuit chip illustrating a first method of integrating the present invention into an integrated circuit chip. In FIG. 11 an integrated circuit chip 500 includes FEOL functional circuit elements 505 (such as transistors), an array of unused (by functional circuits) programmable gates 510 and FEOL defect monitor circuit elements 515. FEOL defect monitor elements may include the FEOL portions of transistors, gates (such as XOR gates), latches and other elements such as multiplexers.

Figure 12:
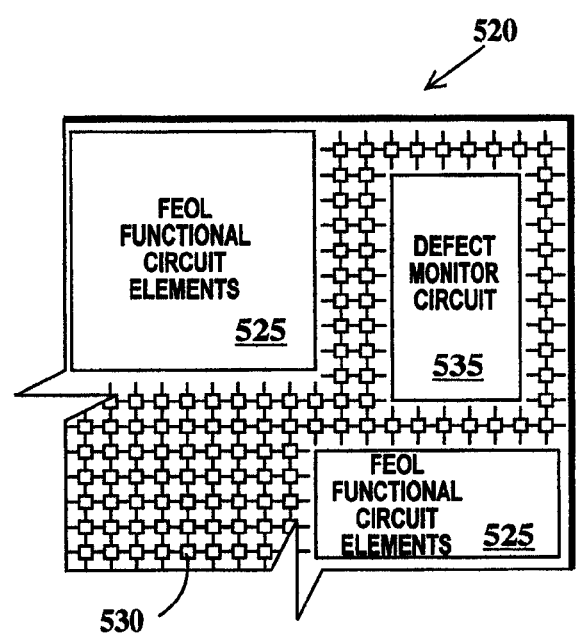
FIG. 12 is a plan view of the front-end-of-line levels of an integrated circuit chip illustrating a second method of integrating the present invention into an integrated circuit.

FIG. 12 is a plan view of the FEOL levels of an integrated circuit chip illustrating a second method of integrating the present invention into an integrated circuit chip. In FIG. 12 an integrated circuit chip 520 includes FEOL functional circuit elements 525 (such as transistors), an array of unused (by functional circuits) programmable gates 530 and FEOL defect monitor circuit elements 535. FEOL defect monitor elements may include the FEOL portions of transistors, gates (such as XOR gates), latches and other elements such as multiplexers.

Figure 13:
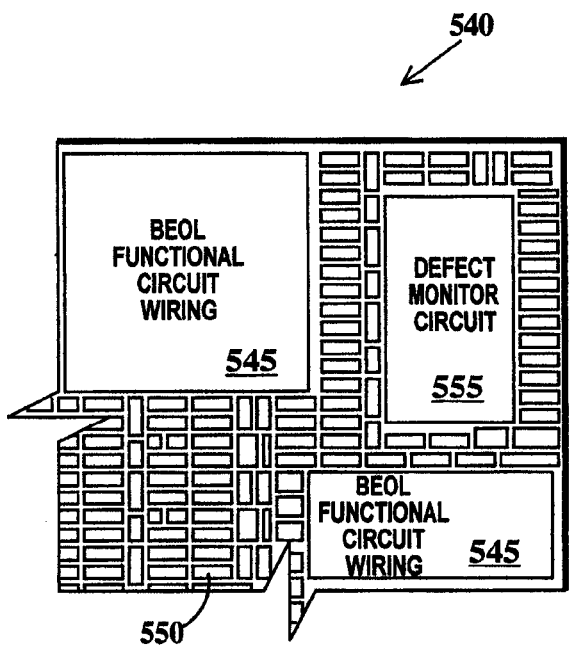
FIG. 13 is a plan view of the back-end-of-line levels of an integrated circuit chip illustrating a method of integrating the present invention into an integrated circuit chip.

FIG. 13 is a plan view of the BEOL levels of an integrated circuit chip illustrating a method of integrating the present invention into an integrated circuit chip. In FIG. 13 an integrated circuit chip 540 includes BEOL functional wiring 545 for functional circuits, a set of BEOL conductive fill shapes 550 (placed to provide chemical-mechanical-polish process uniformity) and BEOL defect monitor circuit wires 555 as well as the wire portions of defect monitor structures. BEOL defect monitor circuit wiring may be formed from fill shapes, may be purposefully designed, or may be a combination of fill shapes and purposefully designed wires.

Thus, the present invention provides improved defect monitoring circuits, defect monitoring strategies and defect monitoring circuits for detecting yield loss mechanisms.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A circuit for monitoring defects in an integrated circuit, comprising:
  a defect monitor comprising a nominally continuous conductor having a length and a multiplicity of conductor segments, each conductor segment having a length, at least a portion of the length of each conductor segment adjacent to a portion of the length of said nominally continuous conductor;
  a first set of sense elements coupled to said nominally continuous conductor at locations along the length of said nominally continuous conductor located between conductor segments;
  a second set sense elements coupled to corresponding conductor segments of multiplicity of conductor segments; and
  gates responsive to a control signal on select inputs of said gates to serially and electrically connect said conductor segments into a nominally electrically continuous conductive path based on a first logical value of said control signal and to electrically disconnect said conductor segments from one another based on a second logical value of said control signal.

2. The circuit of claim 1, wherein:
  said first set of sense elements comprise a first set of latches and said second set of sense elements comprise a second set of latches, said first set of latches and said second set of latches comprise a scan chain having a scan input and a scan output.

3. The circuit of claim 2, wherein:
  said scan chain further includes a setup latch, said first and second logical values of said control signal based on logical values latched by said setup latch.

4. The circuit of claim 2, wherein:
  (a) in the event of an open fault in said nominally continuous conductor, latches of said first set of latches that are coupled between a location of said open fault and said scan output are adapted to switch from an initial state to a fault state;
  (b) in the event of an open fault in a particular conductor segment of said multiplicity of conductor segments, latches of said second set of latches that a coupled between a location of said open fault and said scan output are adapted to switch from an initial state to a fault state; and
  (c) in the event of a short fault between said nominally continuous conductor and said particular conductor segment of said multiplicity of conductor segments, a corresponding latch of said second set of latches that is coupled to said particular conductor segment of said multiplicity of conductor segments is adapted to switch from said initial state to said fault state.

5. The circuit of claim 2, wherein:
  said first set of latches are coupled in series from a first latch to a last latch and said second set of latches are coupled in series from a first latch to a last latch;
  said first latch of said first set of latches adapted to set a first voltage level on said nominally continuous conductor to a first voltage value in the event of a logical one on an output port of a first latch of said first set of latches;
  said first latch of said first set of latches adapted to set said first voltage level on said nominally continuous conductor to a second voltage value in the event of a logical zero on said output port of said first latch of said first set of latches;

said first latch of said second set of latches adapted to set a second voltage level on said conductor segments to said first voltage value in the event of a logical one on an output port of a first latch of said second set of latches; and said first latch of said second set of latches adapted to set said second voltage level on said conductor segments to said second voltage value in the event of a logical zero on said output port of said first latch of said second set of latches.

6. The circuit of claim 5, further including:

providing one or more first devices adapted to apply said second voltage value to any portion of said nominally continuous conductor that becomes electrically disconnected from said output port of said first latch of said first set of latches; and one or more second devices adapted to apply said second voltage value to any conductor segment that becomes electrically disconnected from said output port of said first latch of said second set of latches.

7. The circuit of claim 6, wherein:

said first and second devices are independently selected from the group consisting of diodes, floating gate diodes, transistors, pass gates, transmission gates, other switching devices or combinations thereof, and wherein said gates are transmission gates.

8. The circuit of claim 2, wherein:

said scan chain is a section of a larger scan chain, other sections of said larger scan chain adapted to test functional circuits formed in said integrated circuit.

9. The circuit of claim 1, wherein:

said a spacing between said nominally continuous conductor and a portion of the length of any particular conductor segment of said multiplicity of conductor segments is based on a size of said defects to be detected.

10. A method for monitoring defects in an integrated circuit, comprising:

providing a defect monitor comprising a nominally continuous conductor having a length and a multiplicity of conductor segments, each conductor segment having a length, at least a portion of the length of each conductor segment adjacent to a portion of the length of said nominally continuous conductor;

providing a first set of sense elements;

coupling said first set of sense elements to said nominally continuous conductor at locations along the length of said nominally continuous conductor located between conductor segments;

providing a second set sense elements;

coupling said second set sense elements to corresponding conductor segments of multiplicity of conductor segments; and providing gates responsive to a control signal on select inputs of said gates to serially and electrically connect said conductor segments into a nominally electrically continuous conductive path based on a first logical value of said control signal and to electrically disconnect said conductor segments from one another based on a second logical value of said control signal.

11. The method of claim 10, wherein:

said first set of sense elements comprise a first set of latches and said second set of sense elements comprise a second set latches, said first set of latches and said second set of latches comprise a scan chain having a scan input and a scan output.

12. The method of claim 11, wherein:

said scan chain further includes a setup latch, said first and second logical values of said control signal based on logical values latched by said setup latch.

13. The method of claim 11, wherein:

(a) in the event of an open fault in said nominally continuous conductor, switching latches of said first set of latches that are coupled between a location of said open fault and said scan output from an initial state to a fault state;

(b) in the event of an open fault in a particular conductor segment of said multiplicity of conductor segments, switching latches of said second set of latches that a coupled between a location of said open fault and said scan output from an initial state to a fault state; and (c) in the event of a short fault between said nominally continuous conductor and said particular conductor segment of said multiplicity of conductor segments, switching a corresponding latch of said second set of latches that is coupled to said particular conductor segment of said multiplicity of conductor segments from said initial state to said fault state.

14. The method of claim 11, wherein:

said first set of latches are coupled in series from a first latch to a last latch and said second set of latches are coupled in series from a first latch to a last latch;

said first latch of said first set of latches adapted to set a first voltage level on said nominally continuous conductor to a first voltage value in the event of a logical one on an output port of a first latch of said first set of latches;

said first latch of said first set of latches adapted to set said first voltage level on said nominally continuous conductor to a second voltage value in the event of a logical zero on said output port of said first latch of said first set of latches;

said first latch of said second set of latches adapted to set a second voltage level on said conductor segments to said first voltage value in the event of a logical one on an output port of a first latch of said second set of latches; and said first latch of said second set of latches adapted to set said second voltage level on said conductor segments to said second voltage value in the event of a logical zero on said output port of said first latch of said second set of latches.

15. The method of claim 14, further including:

providing one or more first devices for applying said second voltage value to any portion of said nominally continuous conductor that becomes electrically disconnected from said output port of said first latch of said first set of latches; and providing one or more second devices for applying said second voltage value to any conductor segment that becomes electrically disconnected from said output port of said first latch of said second set of latches.

16. The method of claim 15, wherein:

said first and second devices are independently selected from the group consisting of diodes, floating gate diodes, transistors, pass gates, transmission gates, other switching devices or combinations thereof, and wherein said gates are transmission gates.

17. The method of claim 11, wherein:
said scan chain is a section of a larger scan chain, other sections of said larger scan chain adapted to test functional circuits formed in said integrated circuit.

18. The method of claim 10, wherein a spacing between said nominally continuous conductor and a portion of the length of any particular conductor segment of said multiplicity of conductor segments is based on a size of said defects to be detected.

19. A circuit for monitoring defects in an integrated circuit, comprising:
a scan chain comprising a scan input, a multiplicity of latches coupled in series from a first latch to a second latch and a scan output;
a multiplicity of electrically conductive defect monitor structures, each defect monitor structure coupled between different adjacent latches of said scan chain, an input of each defect monitor structure coupled to an output of a previous latch of said scan chain and an output of each defect monitor structure coupled to an input of an immediately subsequent latch of said scan chain; and
said scan input coupled to an input of said first latch in said scan chain and said scan output coupled to an output of said last latch in said scan chain.

20. The circuit of claim 19, wherein said scan chain includes additional circuit elements interconnected to said multiplicity of latches to allow determination of particular latch or latches at which stuck at faults have occurred.

21. The circuit of claim 19, further including:
a multiplicity of XOR gates coupled in series from a first XOR gate to a last XOR gate, each XOR gate coupled between one latch of said scan chain and one defect monitor structure adjacent to said one latch, a first input of each XOR gate coupled to the output of said one defect monitor structure and an output of each XOR gate couple to the input of said one latch of said scan chain; and
a second input of each XOR gate coupled to the first input of a previous XOR gate except a second input of said first XOR gate is coupled to said scan input.

22. The circuit of claim 19, further including:
a multiplicity of XOR gates coupled in series from a first XOR gate to a second XOR gate, an output of each XOR gate coupled to an input of one latch of said scan chain and a first input each XOR coupled to the output of one defect monitor structure adjacent to said one latch except a first input of said first XOR gate is coupled to said scan input; and
a second input of each XOR gate coupled to a detect/diagnosis signal.

23. The circuit of claim 19, wherein said defect monitor structures are via chains.

24. The circuit of claim 19, wherein groups of one or more of said defect monitor structures comprise different design treatment circuits of a designed experiment, each design treatment circuit comprised of a different combination of integrated circuit process parameters, design parameters, performance parameter or combinations thereof.

25. A method for monitoring defects in an integrated circuit, comprising:
providing a scan chain comprising a scan input, a multiplicity of latches coupled in series from a first latch to a last latch and a scan output;
providing a multiplicity of electrically conductive defect monitor structures, each defect monitor structure coupled between different adjacent latches of said scan chain, an input of each defect monitor structure coupled to an output of a previous latch of said scan chain and an output of each defect monitor structure coupled to an input of an immediately subsequent latch of said scan chain; and
said scan input coupled to an input of said first latch in said scan chain and said scan output coupled to an output of said last latch in said scan chain.

26. The method of claim 25, wherein said scan chain includes additional circuit elements interconnected to said multiplicity of latches to allow determination of particular latch or latches at which stuck at faults have occurred.

27. The method of claim 25, further including:
providing a multiplicity of XOR gates coupled in series from a first XOR gate to a last XOR gate, each XOR gate coupled between one latch of said scan chain and one defect monitor structure adjacent to said one latch, a first input of each XOR gate coupled to the output of said one defect monitor structure and an output of each XOR gate couple to the input of said one latch of said scan chain; and
a second input of each XOR gate coupled to the first input of a previous XOR gate except a second input of said first XOR gate is coupled to said scan input.

28. The method of claim 25, further including:
providing a multiplicity of XOR gates coupled in series from a first XOR gate to a last XOR gate, an output of each XOR gate coupled to an input of one latch of said scan chain and a first input each XOR coupled to the output of one defect monitor structure adjacent to said one latch except a first input of said first XOR gate is coupled to said scan input; and
a second input of each XOR gate coupled to a detect/diagnosis signal.

29. The method of claim 25, wherein said defect monitor structures are via chains.

30. The method of claim 25, wherein groups of one or more of said defect monitor structures comprise different design treatment circuits of a designed experiment, each design treatment circuit comprised of a different combination of integrated circuit process parameters, design parameters, performance parameter or combinations thereof.

* * * * *

UNITED STATES PATENT AND TRADEMARK OFFICE
CERTIFICATE OF CORRECTION

PATENT NO. : 6,998,866 B1  
DATED : February 14, 2006  
INVENTOR(S) : Bazan et al.

Page 1 of 1

It is certified that error appears in the above-identified patent and that said Letters Patent is hereby corrected as shown below:

<u>Title page,</u>  
Item [56], References Cited, U.S. PATENT DOCUMENTS, add  
-- T994,007        3/1976        Booth Jr. et al. --.

<u>Column 5,</u>  
Line 15, delete "has be" and insert -- has been --.

<u>Column 14,</u>  
Line 46, delete "that a coupled" and insert -- that are coupled --.

<u>Column 16,</u>  
Line 16, delete "that a" and insert -- that are --.

Signed and Sealed this

Twenty-fifth Day of April, 2006

JON W. DUDAS  
*Director of the United States Patent and Trademark Office*